United States Patent
Lee et al.

(10) Patent No.: US 9,905,656 B2
(45) Date of Patent: Feb. 27, 2018

(54) SEMICONDUCTOR SUBSTRATE

(71) Applicant: LG SILTRON INC., Gyeongsangbuk-do (KR)

(72) Inventors: Kye-Jin Lee, Gyeongsangbuk-do (KR); Ho-Jun Lee, Daegu (KR); Young-Jae Choi, Gyeonggi-do (KR); Jung-Hyun Eum, Seoul (KR); Chung-Hyun Lee, Gyeongsangbuk-do (KR)

(73) Assignee: SK Siltron Co., Ltd. (KR)

( * ) Notice: Subject to any disclaimer, the term of this patent is extended or adjusted under 35 U.S.C. 154(b) by 0 days.

(21) Appl. No.: 15/397,668

(22) Filed: Jan. 3, 2017

(65) Prior Publication Data

US 2017/0141195 A1    May 18, 2017

Related U.S. Application Data

(62) Division of application No. 14/760,989, filed as application No. PCT/KR2014/000021 on Jan. 3, 2014, now Pat. No. 9,583,575.

(30) Foreign Application Priority Data

Jan. 14, 2013  (KR) .......................... 10-2013-0003983

(51) Int. Cl.
*H01L 29/15* (2006.01)
*H01L 33/00* (2010.01)
(Continued)

(52) U.S. Cl.
CPC .......... *H01L 29/36* (2013.01); *H01L 21/0254* (2013.01); *H01L 21/02458* (2013.01);
(Continued)

(58) Field of Classification Search
CPC .... H01L 29/36; H01L 29/2003; H01L 29/205
(Continued)

(56) References Cited

U.S. PATENT DOCUMENTS

2001/0035531 A1* 11/2001 Kano .................. H01L 21/0242
257/96
2002/0187356 A1 12/2002 Weeks, Jr. et al.
(Continued)

FOREIGN PATENT DOCUMENTS

EP     2 434 532 A1    3/2012
JP     11-298039 A    10/1999
(Continued)

OTHER PUBLICATIONS

Supplementary European Search Report dated Dec. 19, 2016, issued in corresponding EP Application No. 14/737,890.5, 4 pages.
(Continued)

*Primary Examiner* — Dzung Tran
(74) *Attorney, Agent, or Firm* — Lewis Roca Rothgerber Christie LLP

(57) ABSTRACT

Provided is a semiconductor substrate including a seed layer disposed on a substrate, a buffer layer disposed on the seed layer, a plurality of nitride semiconductor layers disposed on the buffer layer, and at least one stress control layer between the plurality of nitride semiconductor layers. The buffer layer includes a plurality of step regions and at least one heterogeneous region. The plurality of step regions includes the same nitride semiconductor material. The heterogeneous region includes a different nitride semiconductor material from the step regions.

10 Claims, 18 Drawing Sheets

(51) Int. Cl.
　　　*H01L 21/02*　　　(2006.01)
　　　*H01L 29/20*　　　(2006.01)
　　　*H01L 29/36*　　　(2006.01)
　　　*H01L 29/205*　　(2006.01)

(52) U.S. Cl.
　　　CPC .... *H01L 21/02507* (2013.01); *H01L 29/2003* (2013.01); *H01L 29/205* (2013.01)

(58) Field of Classification Search
　　　USPC ........... 257/76, 194, 101, 190, 615; 428/446
　　　See application file for complete search history.

(56) References Cited

U.S. PATENT DOCUMENTS

| | | | |
|---|---|---|---|
| 2003/0006409 A1* | 1/2003 | Ohba | H01L 21/0242 257/18 |
| 2004/0012015 A1 | 1/2004 | Saxler | |
| 2004/0183090 A1 | 9/2004 | Kitaoka et al. | |
| 2005/0022725 A1* | 2/2005 | Jurgensen | C30B 25/02 117/104 |
| 2005/0110043 A1 | 5/2005 | Otsuka et al. | |
| 2005/0139818 A1 | 6/2005 | Lee et al. | |
| 2006/0191474 A1* | 8/2006 | Chen | B82Y 20/00 117/104 |
| 2006/0249748 A1* | 11/2006 | Piner | H01L 21/0237 257/183 |
| 2007/0108456 A1 | 5/2007 | Wong et al. | |
| 2007/0139141 A1 | 6/2007 | Knollenberg et al. | |
| 2008/0217645 A1 | 9/2008 | Saxler et al. | |
| 2008/0220555 A1 | 9/2008 | Saxler et al. | |
| 2009/0045438 A1 | 2/2009 | Inoue et al. | |
| 2011/0084311 A1 | 4/2011 | Nelson et al. | |
| 2013/0020583 A1 | 1/2013 | Miyoshi et al. | |

FOREIGN PATENT DOCUMENTS

| | | |
|---|---|---|
| JP | 2005-191519 A | 7/2005 |
| JP | 2007-116097 A | 5/2007 |
| JP | 2010-521064 A | 6/2010 |
| JP | 2011-216548 A | 10/2011 |
| JP | 2011-254068 A | 12/2011 |
| JP | 2012-84662 A | 4/2012 |
| JP | 2012-243886 A | 12/2012 |
| JP | 2014-53611 A | 3/2014 |
| JP | 2014-63903 A | 4/2014 |
| KR | 10-2012-0078343 A | 7/2012 |
| WO | WO 2011/039181 A1 | 4/2011 |
| WO | WO 2011/122322 A1 | 10/2011 |
| WO | WO 2011/155496 A1 | 12/2011 |
| WO | WO 2012/089703 A1 | 7/2012 |

OTHER PUBLICATIONS

JP Office action dated Jul. 26, 2016 issued in corresponding Application No. 2015-552569, with English machine translation, 13 pages.
Supplementary Partial European Search Report completed Aug. 10, 2016, dated Nov. 19, 2016 corresponding to EP Application No. 14737890, 2 pages.
Feltin, Eric et al., "Stress control in GaN grown on silicon (111) by metalorganic vapor phase epitaxy", *Applied Physics Letters*, vol. 79, No. 20, Nov. 12, 2001, pp. 3230-3232, XP012029401.
International Search Report; PCT Application No. PCT/KR2014/000021; dated Mar. 3, 2014 (6 pages).
Korean office action, KR Application No. 10-2013-0003983, dated Mar. 3, 2014 (51 pages).

* cited by examiner

FIG. 6A
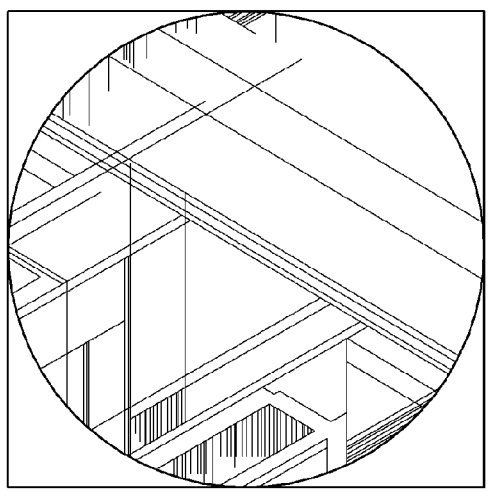
FIG. 6B
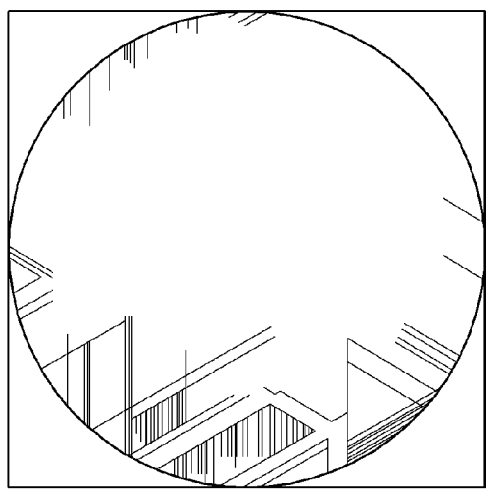
FIG 6.C
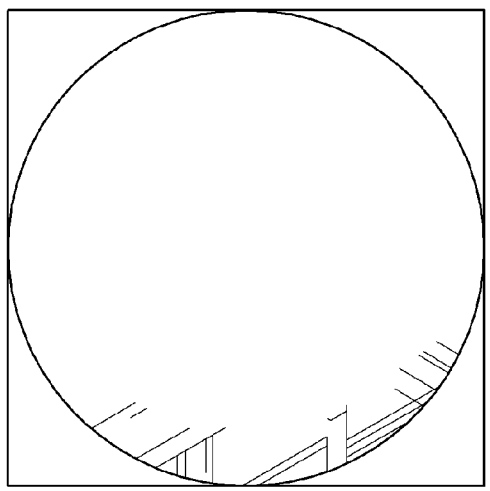

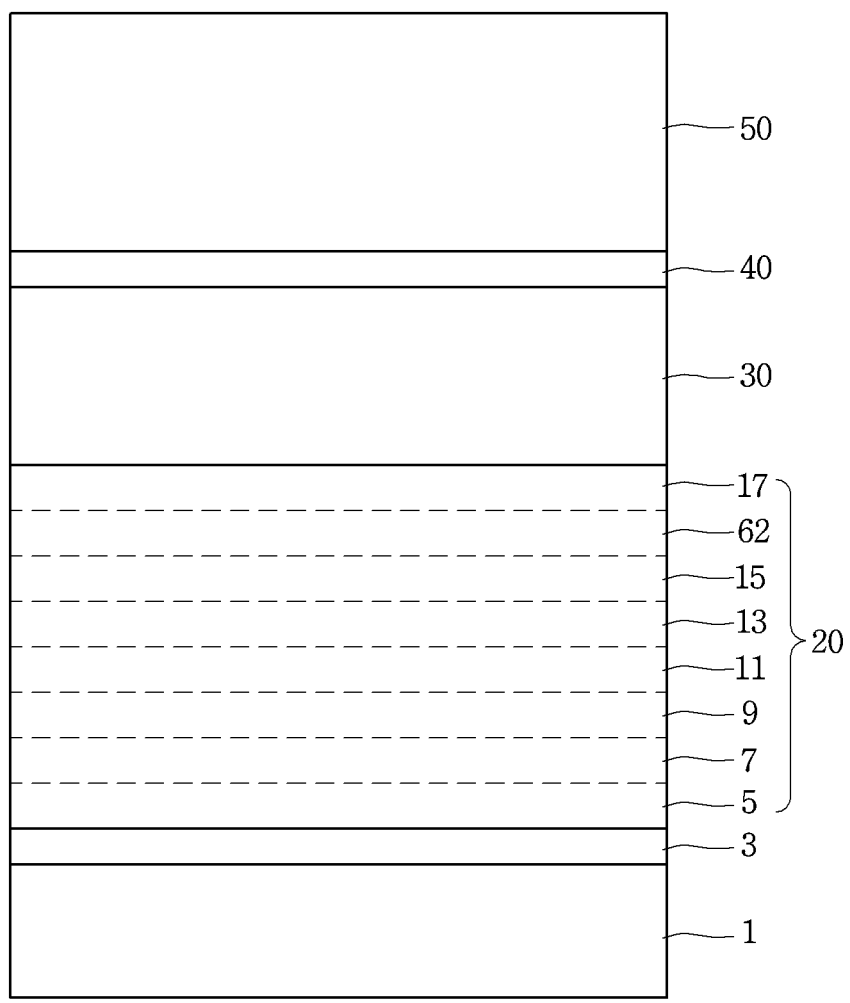

DISLOCATION

FIG. 17A
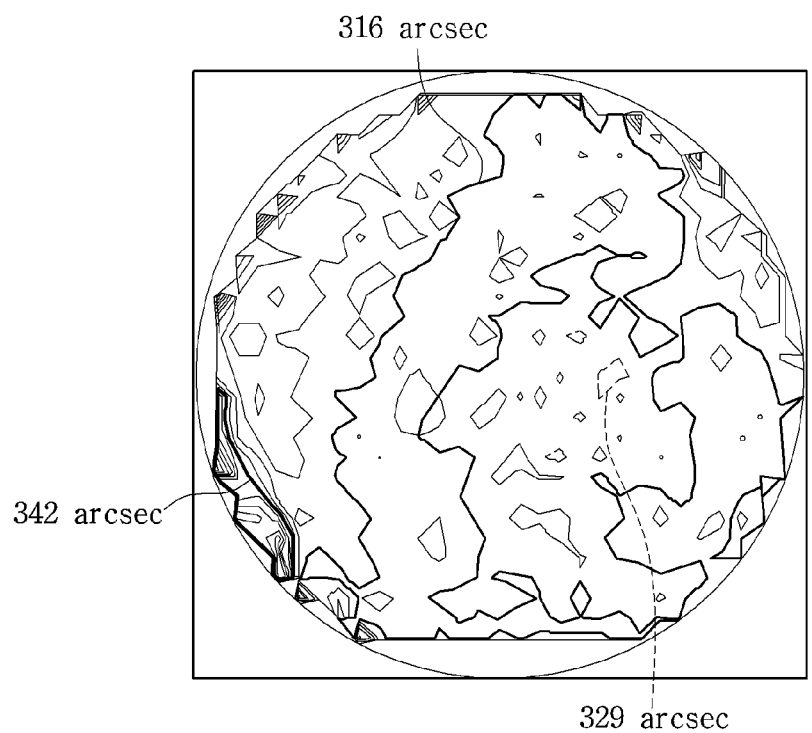
316 arcsec
342 arcsec
329 arcsec
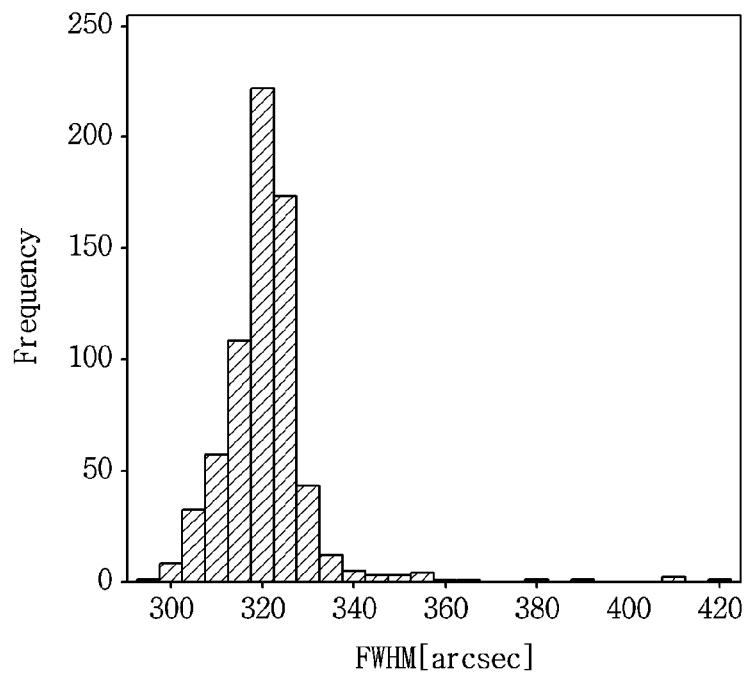
FIG. 17B

1

SEMICONDUCTOR SUBSTRATE

CROSS-REFERENCE TO RELATED APPLICATIONS

The present application is a divisional of U.S. patent application Ser. No. 14/760,989, filed Jul. 14, 2015, which is a national phase application of International Application PCT/KR2014/000021, with an international filing date of Jan. 3, 2014, which claims the priority benefit of Korean Application No. 10-2013-0003983, filed Jan. 14, 2013, the contents of each of which are incorporated herein by reference in their entirety for all purposes.

BACKGROUND OF THE INVENTION

1. Field of the Invention

The present disclosure relates to a semiconductor substrate.

2. Description of the Related Art

Various electronic devices using compound semiconductor materials have been developed.

Solar cells, photodetectors, and light-emitting devices may be used as electronic devices.

Such electronic devices may be fabricated on the basis of a semiconductor substrate. The semiconductor substrate includes a growth substrate and a compound semiconductor layer grown thereon.

In the semiconductor substrate, various defects may be formed due to a difference in lattice constants, thermal expansion coefficients, or strains between the growth substrate and the compound semiconductor layer.

A typical semiconductor substrate has limitations in that crystallinity may be decreased by the generation of dislocations caused by the difference in the lattice constants between the growth substrate and the compound semiconductor layer.

In addition, the differences in the lattice constants and the thermal expansion coefficients between the growth substrate and the compound semiconductor layer cause strain. That is, a balance between compressive strain during the growth of compound semiconductors and tensile strain during cooling to room temperature after the growth does not match, and eventually, cracks may occur in the compound semiconductor layer or the growth substrate may be broken.

With respect to a typical semiconductor substrate, since cracks may occur in the compound semiconductor layer, a high-quality, thick semiconductor layer substantially functioning as an electronic device may not be grown.

SUMMARY OF THE CLAIMED INVENTION

Disclosure of the Invention Technical Problem

Embodiments provide a semiconductor substrate which may improve crystallinity by controlling dislocations.

Embodiments also provide a semiconductor substrate which may increase the thickness of a semiconductor layer substantially functioning as an electronic device by controlling strain.

Technical Solution

In one embodiment, a semiconductor substrate includes: a substrate; a seed layer disposed on the substrate; a buffer layer disposed on the seed layer; and a plurality of nitride semiconductor layers disposed on the buffer layer, wherein at least one stress control layer is included between the plurality of nitride semiconductor layers.

In another embodiment, a semiconductor substrate includes: a substrate; a seed layer disposed on the substrate; a buffer layer disposed on the seed layer; a crystallinity control layer disposed on the buffer layer; a plurality of nitride semiconductor layers disposed on the crystallinity control layer; and at least one stress control layer between the plurality of nitride semiconductor layers, wherein the crystallinity control layer includes at least one mask layer, the buffer layer includes a plurality of step regions and at least one heterogeneous region, the plurality of step regions includes a first step region and a second step region that are adjacent to the seed layer, the seed layer and the plurality of step regions include aluminum (Al), and a difference in amounts of Al between the seed layer and the first step region is in a range of 30% to 60%.

Advantageous Effects

According to an embodiment, compressive strain may be maximized by including a buffer layer including a plurality of step regions having different amounts of aluminum (Al) and reducing the amount of Al in the step region of the lowermost region of the buffer layer in contact with a seed layer by at least 30% in comparison to an amount of Al in the seed layer, and thus, a thick, crack-free conductive type semiconductor layer may be grown.

According to an embodiment, a heterogeneous region is formed between the plurality of step regions of the buffer layer to make the top surface of a semiconductor layer above the heterogeneous region as a flat surface, and thus, crystallinity may be improved.

According to an embodiment, the heterogeneous region blocks dislocations generated in the buffer layer, and as a result, the generation of dislocations in a nitride semiconductor layer formed on the heterogeneous region may be minimized to improve the crystallinity.

According to an embodiment, stress is controlled by the heterogeneous region and the step regions by disposing the heterogeneous region between the step regions of the buffer layer, and thus, cracks may not only occur in a nitride layer formed on the buffer layer, but a growth substrate may also not be broken.

According to an embodiment, dislocations of the buffer layer are primarily blocked by mask patterns of a mask layer and dislocations moving in a vertical direction between the mask patterns are guided to a horizontal direction, thereby enabling the dislocations not to move in the vertical direction any more. Accordingly, since dislocations may hardly occur in a nitride semiconductor formed on the mask layer, a decrease in the crystallinity due to the dislocations may be prevented.

According to an embodiment, since a crystallinity control layer including a plurality of mask layers and a plurality of nitride semiconductor layers is formed to increase compressive strain, tensile strain generated during cooling in post processing is compensated. Thus, cracks may not only occur in a nitride semiconductor layer formed on the crystallinity control layer, but a growth substrate may also not be broken.

BRIEF DESCRIPTION OF THE FIGURES

FIGS. 6A to 6C illustrate surface states of the semiconductor substrate according to the number of step regions;

FIG. 9 is a cross-sectional view illustrating a semiconductor substrate according to a second embodiment;

FIGS. 17A and 17B illustrate crystallinity of the semiconductor substrate of FIG. 14;

DETAILED DESCRIPTION

In the description of embodiments according to the present disclosure, it will be understood that, when an element is referred to as being formed "on" or "under" another element, it can be directly "on" or "under" the other element or be indirectly formed with intervening elements therebetween. In addition, when an element is referred to as being formed "on or under", the term encompasses both an orientation of above and below.

Figure 1:
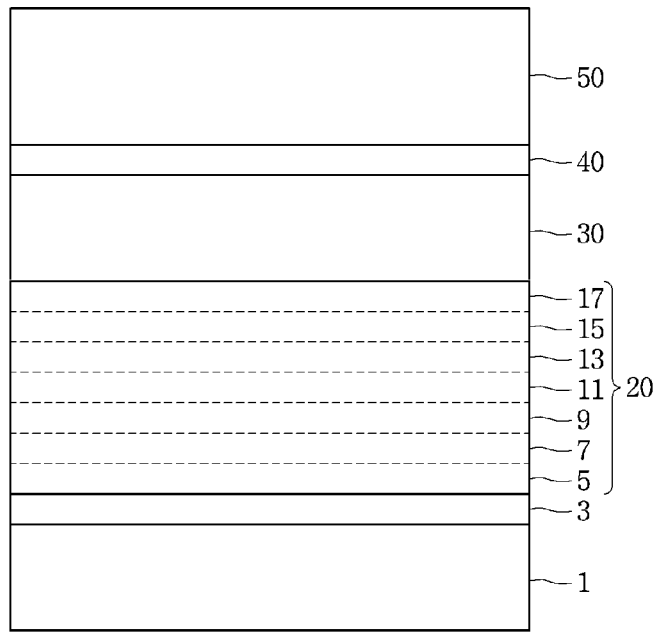
FIG. 1 is a cross-sectional view illustrating a semiconductor substrate according to a first embodiment.
Figure 2:
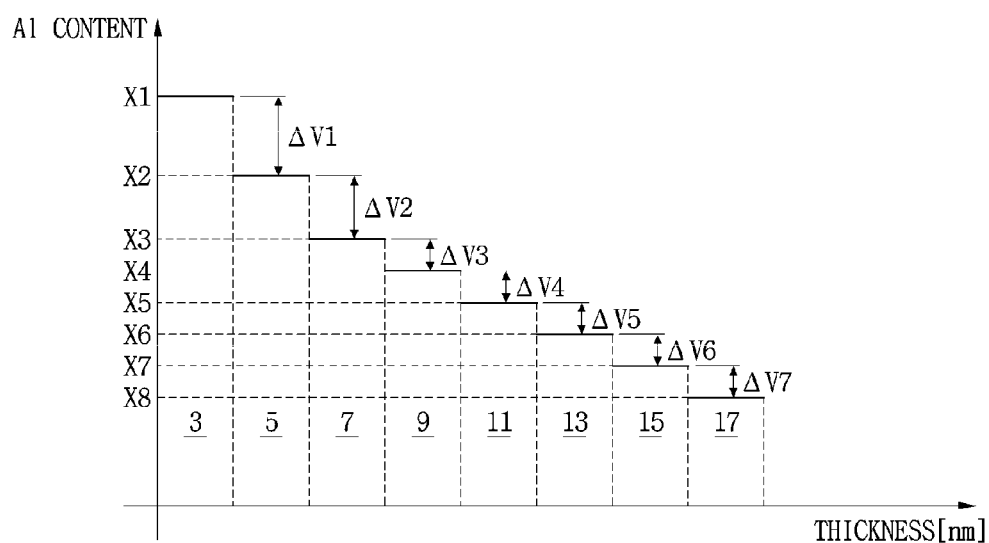
FIG. 2 illustrates an amount of aluminum (Al) in a buffer layer of FIG. 1.

FIG. 1 is a cross-sectional view illustrating a semiconductor substrate according to a first embodiment.

Referring to FIG. 1, the semiconductor substrate according to the first embodiment may include a growth substrate 1, a seed layer 3, a buffer layer 20, a first nitride semiconductor layer 30, a stress control layer 40, and a second nitride semiconductor layer 50.

The at least one stress control layer 40 may be formed, but the present disclosure is not limited thereto.

The semiconductor substrate according to the first embodiment may function as a base substrate for preparing an electronic device, such as a solar cell, a photodetector, or a light-emitting device, but the present disclosure is not limited thereto.

The seed layer 3, the buffer layer 20, the first nitride semiconductor layer 30, the stress control layer 40, and the second nitride semiconductor layer 50 may be formed of Group II-IV and/or Group III-V compound semiconductor materials, but the present disclosure is not limited thereto.

The growth substrate 1 may be formed of at least on selected from the group consisting of sapphire (Al2O3), SiC, silicon (Si), GaAs, GaN, ZnO, GaP, InP, and germanium (Ge). For example, the growth substrate 1 may include Si, but the present disclosure is not limited thereto.

The seed layer 3 may function as a seed for easily forming an epitaxial layer formed on the growth substrate 1, i.e., the buffer layer 20, the first nitride semiconductor layer 30, the stress control layer 40, and the second nitride semiconductor layer 50.

The seed layer 3 may be $Al_{x1}Ga_{(1-x1)}N$, but the present disclosure is not limited thereto. X1 may be 0.7 to 1, but the present disclosure is not limited thereto.

The seed layer 3 may be grown at a high temperature, for example, in a temperature range of 1050° C. to 1100° C., but the present disclosure is not limited thereto. That is, the seed layer 3 may be grown at a low temperature, for example, 900° C. When the seed layer 3 is grown at low temperature, the seed layer 3 may have properties similar to those of amorphous materials and thus, the seed layer 3 may be less affected by a crystal structure of the growth substrate 1. Therefore, the occurrence of crystal defects due to lattice mismatch between the growth substrate 1 and the seed layer 3 may be reduced.

Dislocations due to lattice constants and stress due to the lattice constants and thermal expansion coefficients may be generated between the growth substrate 1 and the epitaxial layer. The stress may directly or indirectly contribute to the occurrence of cracks in the second nitride semiconductor layer 50.

In order to suppress these defects, the buffer layer 20, for example, may be grown between the seed layer 3 and the second nitride semiconductor layer 50.

Since a difference in lattice constants between the growth substrate 1 and the second nitride semiconductor layer 50 may be reduced by the buffer layer 20, dislocations generated in the second nitride semiconductor layer 50 may be suppressed.

The buffer layer 20, for example, may be grown in a temperature range of 1050° C. to 1100° C., but the present disclosure is not limited thereto. For example, the buffer layer 20 may be grown at 1070° C., but the present disclosure is not limited thereto.

The first nitride semiconductor layer 30 may be grown on the buffer layer 20. The first nitride semiconductor layer 30 may be GaN, but the present disclosure is not limited thereto.

The first nitride semiconductor layer 30 may function to change tensile strain, which may occur in the seed layer 3 due to differences in the lattice constant and thermal expansion coefficient with respect to the growth substrate 1, into compressive strain, but the present disclosure is not limited thereto.

The second nitride semiconductor layer 50 is grown and a cooling process to room temperature is then performed. The semiconductor substrate according to the first embodiment is subjected to tensile strain due to the cooling process. Thus, when growing the epitaxial layer on the growth substrate 1, compress strain should be increased in advance to compensate the tensile strain generated during the cooling process to room temperature so that an equilibrium strain state may be eventually maintained. Therefore, cracks may not only occur in the second nitride semiconductor layer 50, but the growth substrate 1 may also not be broken.

The first nitride semiconductor layer 30 may be an undoped semiconductor layer which does not include a dopant, but the present disclosure is not limited thereto. That is, the first nitride semiconductor layer 30 may be the second nitride semiconductor layer 50 including a dopant.

The stress control layer 40 may be grown on the first nitride semiconductor layer 30, but the present disclosure is not limited thereto. The stress control layer 40 may function to further increase compressive strain caused by the first nitride semiconductor layer 30 in order to maintain the equilibrium strain state during the subsequent cooling to room temperature.

The stress control layer 40 may be grown at a low temperature, for example, in a temperature range of 850° C. to 950° C., but the present disclosure is not limited thereto. That is, the stress control layer 40 may be grown at a high temperature, for example, in a temperature range of 1050° C. to 1100° C.

The stress control layer 40 may be AlN, but the present disclosure is not limited thereto.

Since a lattice constant of the stress control layer 40 including AlN is smaller than a lattice constant of the first nitride semiconductor layer 30 including GaN, compressive strain may be further increased.

The stress control layer 40 may have a multilayer structure of AlGaN/AlN/AlGaN, but the present disclosure is not limited thereto. In this case, a concentration of aluminum (Al) in the AlN layer may be higher than a concentration of Al in the AlGaN layer, and an amount of Al in the AlGaN layer may be linearly or stepwise changed, but the present disclosure is not limited thereto.

The stress control layer 40 may have a multilayer structure in which one cycle including AlGaN/AlN/AlGaN is repeated, but the present disclosure is not limited thereto.

The stress control layer 40 may have a multilayer structure in which AlGaN and AlN are alternatingly formed, but the present disclosure is not limited thereto.

The second nitride semiconductor layer 50 may be grown on the stress control layer 40 and may include an n-type dopant, but the present disclosure is not limited thereto.

That is, the second nitride semiconductor layer 50 may include a p-type dopant. Si, Ge, or tin (Sn) may be used as the n-type dopant, but the present disclosure is not limited thereto. Magnesium (Mg), zinc (Zn), calcium (ca), strontium (Sr), or barium (Ba) may be used as the p-type dopant, but the present disclosure is not limited thereto.

The second nitride semiconductor layer 50 may be an undoped or non-conductive semiconductor layer which does not include a dopant. In this case, in order to have a function of an electronic device, a plurality of conductive type semiconductor layers and a plurality of non-conductive type semiconductor layers may be formed on the second nitride semiconductor layer 50, but the present disclosure is not limited thereto.

The second nitride semiconductor layer 50 may play a substantial function to obtain a solar cell, a photodetector, or a light-emitting device.

For example, the function of a photodetector or a solar cell may be realized by growing another conductive type semiconductor layer on the second nitride semiconductor layer 50, but the present disclosure is not limited thereto.

For example, the function of a light-emitting device may be realized by growing an active layer on the second nitride semiconductor layer 50 and growing another conductive type semiconductor layer on the active layer, but the present disclosure is not limited thereto.

The second nitride semiconductor layer 50 and the another conductive type semiconductor layer may include an opposite type dopant. For example, in a case in which the second nitride semiconductor layer 50 includes an n-type dopant, the another conductive type semiconductor layer may include a p-type dopant, but the present disclosure is not limited thereto.

According to the semiconductor substrate according to the first embodiment, the thick, crack-free second nitride semiconductor layer 50 may be grown by increasing compressive strain as much as possible.

For this purpose, the buffer layer 20 may include a plurality of step regions 5, 7, 9, 11, 13, 15, and 17 having different amounts of Al.

For example, as illustrated in FIG. 1, the buffer layer 20 may include first to seventh step regions 5, 7, 9, 11, 13, 15, and 17, but the present disclosure is not limited thereto.

A lowermost region of the buffer layer 20 in contact with a top surface of the seed layer 3 may be the first step region 5, and an uppermost region of the buffer layer 20 in contact with a back surface of the first nitride semiconductor layer 30 may be the seventh step region 17.

The first to seventh step regions 5, 7, 9, 11, 13, 15, and 17 may include the same nitride semiconductor material. For example, the first to seventh step regions 5, 7, 9, 11, 13, 15, and 17 may include $Al_xGa_{(1-x)}N$. In this case, x may be different in the first to seventh step regions 5, 7, 9, 11, 13, 15, and 17.

Thus, the first step region 5 may include $Al_{x2}Ga_{(1-x2)}N$, the second step region 7 may include $Al_{x3}Ga_{(1-x3)}N$, the third step region 9 may include $Al_{x4}Ga_{(1-x4)}N$, and the fourth step region 11 may include $Al_{x5}Ga_{(1-x5)}N$. Also, the fifth step region 13 may include $Al_{x6}Ga_{(1-x6)}N$, the sixth step region 15 may include $Al_{x7}Ga_{(1-x7)}N$, and the seventh step region 17 may include $Al_{x8}Ga_{(1-x8)}N$.

$X2$ of the first step region 5 may be smaller than $x1$ of the seed layer 3 by 0.3 to 0.6, but the present disclosure is not limited thereto.

If $x1$ is 1, i.e., in a case in which the seed layer 3 includes AlN, $x2$ of the first step region 5 may be 0.4 to 0.7.

Experimental data related thereto are listed in Table 1.

TABLE 1

|  | Seed layer ($\times 1$) | The first step region ($\times 2$) | $\Delta V1$ | Strain (curvature) |
| --- | --- | --- | --- | --- |
| Comparative Example 1 | 1 | 0.9 | 0.1 | −78.3 |
| Example 1 | 1 | 0.7 | 0.3 | −92.8 |
| Example 2 | 1 | 0.5 | 0.5 | −97.5 |

A difference in the amounts of Al between the seed layer and the first step region in Comparative Example 1 was 0.1, (x2−x1), a difference in the amounts of Al between the seed layer 3 and the first step region 5, in Example 1 was 0.3, and (x2−x1), a difference in the amounts of Al between the seed layer 3 and the first step region 5, in Example 2 was 0.5.

Figure 3:
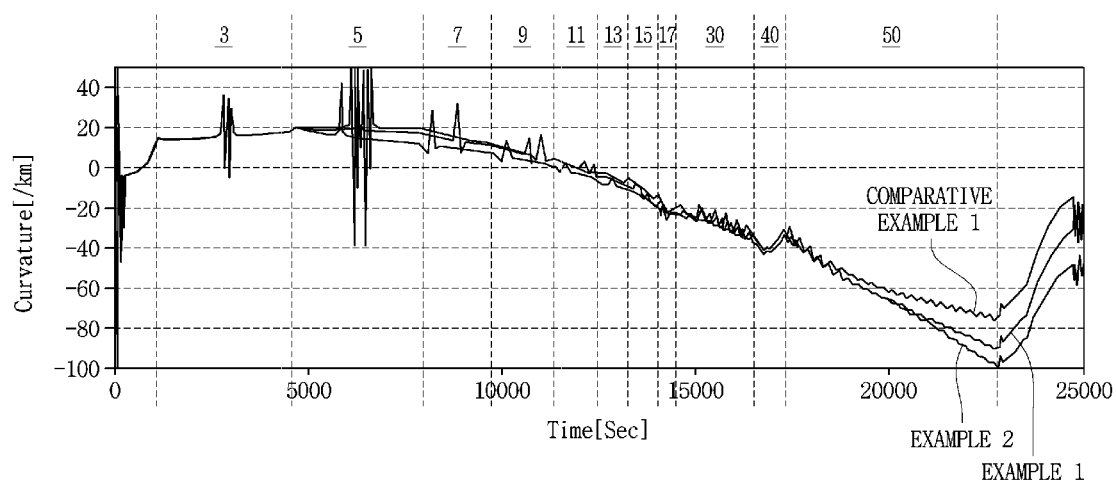
FIG. 3 is a graph illustrating a strain state according to a difference in amounts of Al between a seed layer and a first step region.

Referring to Table 1 and FIG. 3, compressive strain in Comparative Example 1 was 78.3, compressive strain in Example 1 was 92.8, and compressive strain in Example 2 was 97.5.

From the above results, it may be confirmed that the maximum compressive strain was obtained when the difference in the amounts of Al between the seed layer 3 and the first step region 5 was in a range of 0.3 to 0.6.

In addition, x3 of the second step region 7 may be smaller than x2 of the first step region 5 by 0.2 to 0.4, but the present disclosure is not limited thereto.

Figure 4:
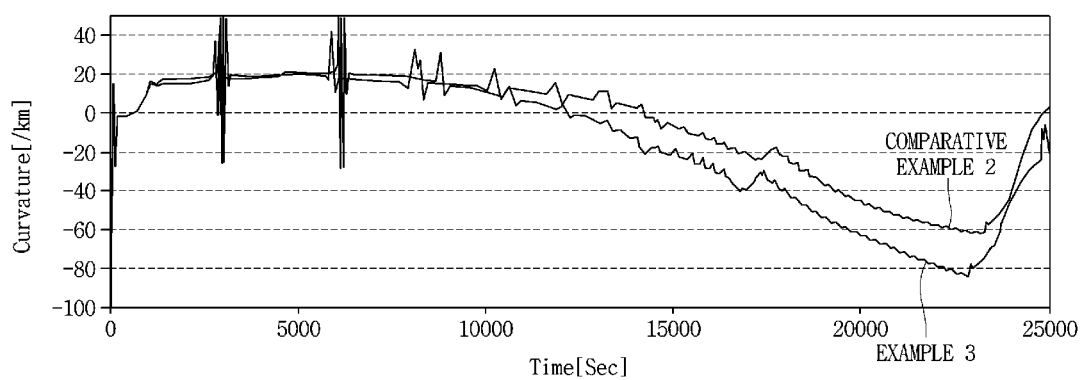
FIG. 4 is a graph illustrating a strain state according to a difference in amounts of Al between a second step region and a third step region.

Experimental data related thereto are listed in Table 2 and strain is illustrated in FIG. 4.

TABLE 2

|  | The first step region (x2) | The second step region (x3) | ΔV2 | Strain (curvature) |
|---|---|---|---|---|
| Comparative Example 2 | 0.5 | 0.425 | 0.075 | −64.0 |
| Example 3 | 0.7 | 0.425 | 0.275 | −81.8 |

(x3−x2), a difference in the amounts of Al between the first step region and the second step region, in Comparative Example 2 was 0.075, and (x3−x2), a difference in the amounts of Al between the first step region 5 and the second step region 7, in Example 3 was 0.275.

Referring to Table 2 and FIG. 4, compressive strain in Comparative Example 2 was 64, and in contrast, compressive strain in Example 3 was 81.8.

Thus, it may be confirmed that the compressive strain may be increased when (x3−x2), the difference in the amounts of Al between the first step region 5 and the second step region 7, was in a range of 0.2 to 0.4.

The amounts of Al in the third to the seventh step regions 9, 11, 13, 15, and 17 may be linearly or non-linearly decreased, but the present disclosure is not limited thereto.

For example, the amounts of Al in the third to the seventh step regions 9, 11, 13, 15, and 17 were respectively 0.5, 0.4, 0.3, 0.2, and 0.1, in which a difference in the amounts of Al between the adjacent step regions (ΔV3, ΔV4, ΔV5, ΔV6, and ΔV7) may be constant at 0.1.

For example, the amounts of Al in the third to the seventh step regions 9, 11, 13, 15, and 17 were respectively 0.5, 0.3, 0.2, 0.1, and 0.05, in which a difference in the amounts of Al between the adjacent step regions (ΔV3, ΔV4, ΔV5, ΔV6, and ΔV7) may not be constant. The difference in the amounts of Al between the third and fourth step regions 9 and 11 (ΔV4) was 0.2, and in contrast, the difference in the amounts of Al between the fourth and fifth step regions 11 and 13 (ΔV5) may be 0.1.

Since the semiconductor substrate according to the first embodiment includes the buffer layer 20, which includes the plurality of step regions 5, 7, 9, 11, 13, 15, and 17 having different amounts of Al, and reduces the amount of Al in the step region 5 of the lowermost region of the buffer layer 20 in contact with the seed layer 3 by at least 30% in comparison to the amount of Al in the seed layer 3, the compressive strain may be maximized. Thus, the thick, crack-free second nitride semiconductor layer 50 may be grown.

The number of the step regions 5, 7, 9, 11, 13, 15, and 17 included in the buffer layer 20 may be in a range of 5 to 10, but the present disclosure is not limited thereto.

Figure 5:
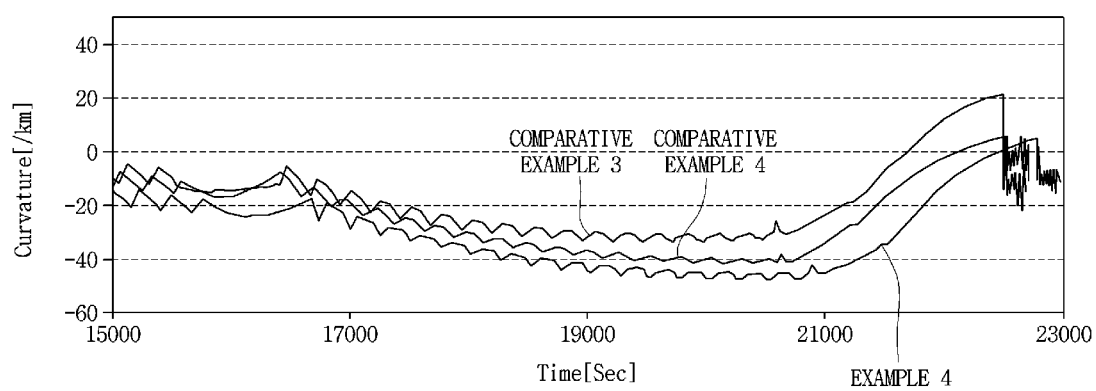
FIG. 5 illustrates a strain state according to the number of step regions.

In FIG. 5, Comparative Example 3 was a case in which the number of the step regions was 3, Comparative Example 4 was a case in which the number of the step regions was 5, and Example 4 was a case in which the number of the step regions 5, 7, 9, 11, 13, 15, and 17 was 7.

As illustrated in FIG. 5, it may be understood that compressive strain of Comparative Example 4 was greater than that of Comparative Example 3, and compressive strain of Example 4 was greater than that of Comparative Example 4.

FIG. 6A illustrates a state of the semiconductor substrate, i.e., a state of a conductive type semiconductor layer, in Comparative Example 3 of FIG. 5, FIG. 6B illustrates a surface state of a conductive type semiconductor layer in Comparative Example 4 of FIGS. 5, and 6C illustrate a state of a conductive type semiconductor layer in Example 4 of FIG. 5.

As illustrated in FIG. 6A, in the case in which the number of the step regions was 3 (Comparative Example 3), severe cracks were observed.

As illustrated in FIG. 6B, in the case in which the number of the step regions was 5 (Comparative Example 4), cracks were reduced.

As illustrated in FIG. 6C, in the case in which the number of the step regions 5, 7, 9, 11, 13, 15, and 17 was 7 (Example 4), cracks almost did not occur.

Thus, it was confirmed that the compressive strain was increased as the number of the step regions 5, 7, 9, 11, 13, 15, and 17 was increased, and cracks were reduced or did not occur in the second nitride semiconductor layer 50 of the semiconductor substrate due to the increase in the compressive strain.

As a result, it was confirmed that cracks were almost absent when the number of the step regions in the buffer layer 20 was in a range of 5 to 10. When the number of the step regions was 10 or more, cracks were removed, but the thickness of the buffer layer 20 may increase.

A thickness of each of the step regions 5, 7, 9, 11, 13, 15, and 17 included in the buffer layer 20 may be the same or different from one another, but the present disclosure is not limited thereto.

The thickness of each of the step regions 5, 7, 9, 11, 13, 15, and 17 included in the buffer layer 20 may be in a range of 100 nm to 150 nm, but the present disclosure is not limited thereto. For example, the thickness of each of the step regions 5, 7, 9, 11, 13, 15, and 17 included in the buffer layer 20 may be 130 nm, but the present disclosure is not limited thereto.

Figure 7:
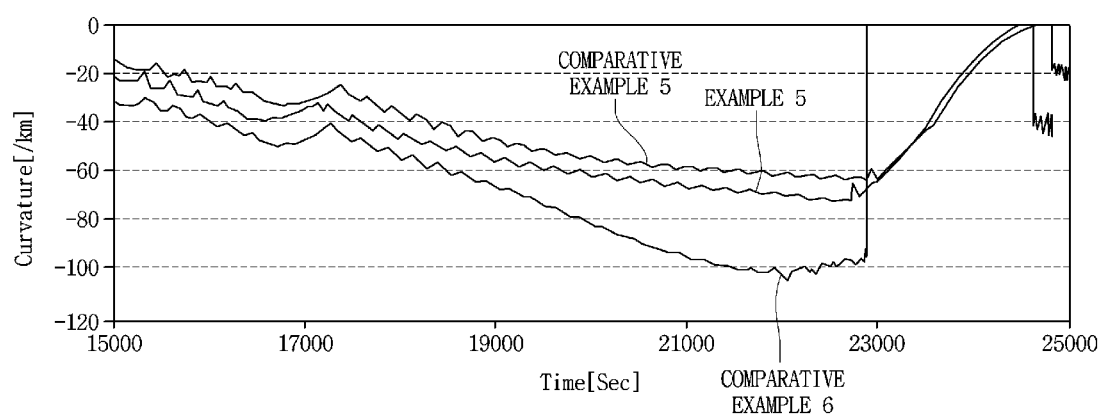
FIG. 7 illustrates a strain state according to a thickness of a step region.

In FIG. 7, Comparative Example 5 was a case in which the thickness of the each step region was 91 nm, and Comparative Example 6 was a case in which the thickness of the each step region was 149.5 nm. Example 5 was a case in which the thickness of each of the step regions 5, 7, 9, 11, 13, 15, and 17 was 130 nm.

Figure 8A:
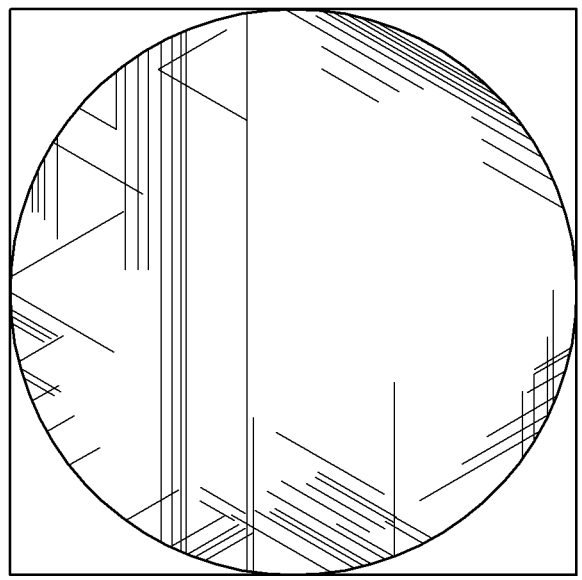
FIGS. 8A and 8B illustrate surface states of the semiconductor substrate according to the thickness of the step region.
Figure 8B:
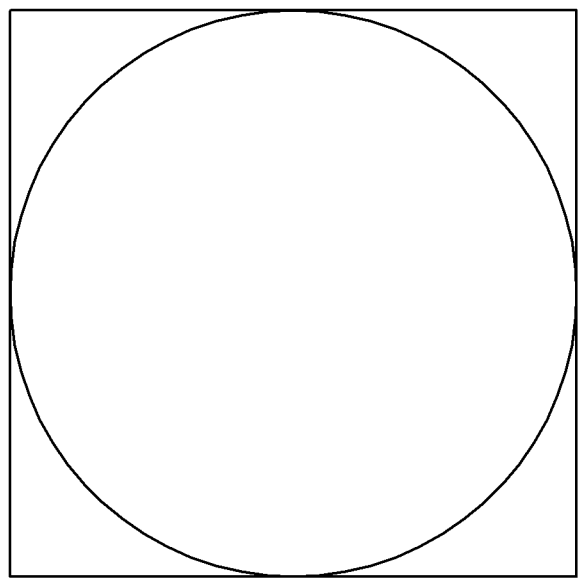

FIG. 8A illustrates a state of a conductive type semiconductor layer in Comparative Example 5 of FIG. 7, and FIG. 8B illustrates a state of a conductive type semiconductor layer in Example 5.

When the thickness of the each step region was smaller than that of Example 5 (Comparative Example 5), many cracks occurred in the conductive type semiconductor layer as illustrated in FIG. 8A.

As illustrated in FIG. 8B, cracks almost did not occur in the second nitride semiconductor layer 50 of Example 5.

Although not shown in the drawings, when the thickness of the each step region was greater than that of Example 5 (Comparative Example 6), the growth substrate of the semiconductor substrate according to the first embodiment was broken. It may be understood that the compressive strain in Comparative Example 6 of FIG. 7 was excessively increased, the growth substrate gradually received tensile strain so as to obtain an equilibrium state (strain=0) during the cooling process to room temperature, and the growth substrate was unable to withstand the strain and broken at some point, i.e., before the equilibrium state.

Thus, the thickness of each of the step regions 5, 7, 9, 11, 13, 15, and 17 of the buffer layer 20 may be in a range of 100 nm to 150 nm.

FIG. 9 is a cross-sectional view illustrating a semiconductor substrate according to a second embodiment.

The second embodiment is substantially similar to the first embodiment except a buffer layer 20 including a plurality of step regions 5, 7, 9, 11, 13, 15, and 17 and a single heterogeneous region 62. Thus, in the following description of the second embodiment, the same reference numerals will be assigned to the same elements having the same shape or function as those of the first embodiment and the details thereof will be omitted.

Referring to FIG. 9, the semiconductor substrate according to the second embodiment may include a growth substrate 1, a seed layer 3, the buffer layer 20, a first nitride semiconductor layer 30, a stress control layer 40, and a second nitride semiconductor layer 50.

The buffer layer 20 may include first to seventh step regions 5, 7, 9, 11, 13, 15, and 17 and the heterogeneous region 62. The heterogeneous region 62 may be formed between any one of the first and second step regions 5 and 7, the second and third step regions 7 and 9, the third and fourth step regions 9 and 11, the fourth and fifth step regions 11 and 13, the fifth and sixth step regions 13 and 15, and the sixth and seventh step regions 15 and 17, but the present disclosure is not limited thereto.

In FIG. 9, the heterogeneous region 62 is disposed between the sixth and seventh step regions 15 and 17, but the second embodiment is not limited thereto.

The heterogeneous region 62 may include a different nitride semiconductor material from the first to seventh step regions 5, 7, 9, 11, 13, 15, and 17.

For example, the first to seventh step regions 5, 7, 9, 11, 13, 15, and 17 may include AlxGa(1−x)N. In this case, x may be different in the first to seventh step regions 5, 7, 9, 11, 13, 15, and 17.

An amount (X2) of Al in the first step region 5 may be smaller than an amount (x1) of Al in the seed layer 3 by 0.3 to 0.6, but the present disclosure is not limited thereto.

The heterogeneous region 62 may include AlxInyGa(1−x−y)N. Herein, x may be 0 (x=0), and y may be equal to or greater than 0 and may be equal to or less than 1 (0≤y≤1), but the present disclosure is not limited thereto.

For example, the heterogeneous region 62 may be one of InN, InGaN, and GaN, but the present disclosure is not limited thereto.

The heterogeneous region 62 may be a non-conductive type semiconductor layer which does not include a dopant, but the present disclosure is not limited thereto.

Figure 10:
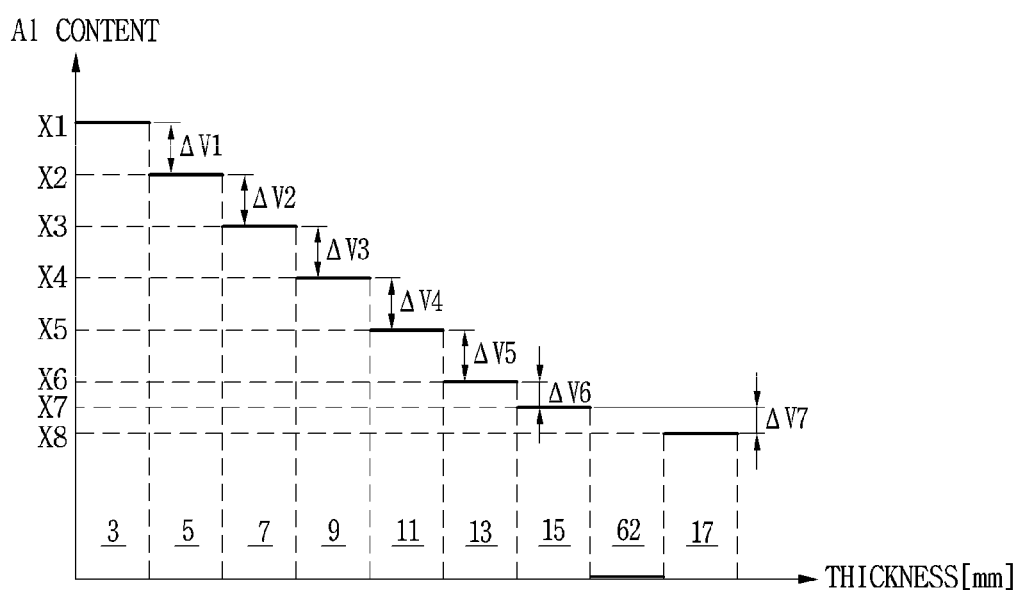
FIG. 10 illustrates an amount of Al in a buffer layer of FIG. 9.

As illustrated in FIG. 10, amounts (x2 to x8) of Al in the first to seventh step regions 5, 7, 9, 11, 13, 15, and 17 are different from one another. In contrast, the amount (x) of Al in the heterogeneous region 62 may be 0.

Figure 11A:
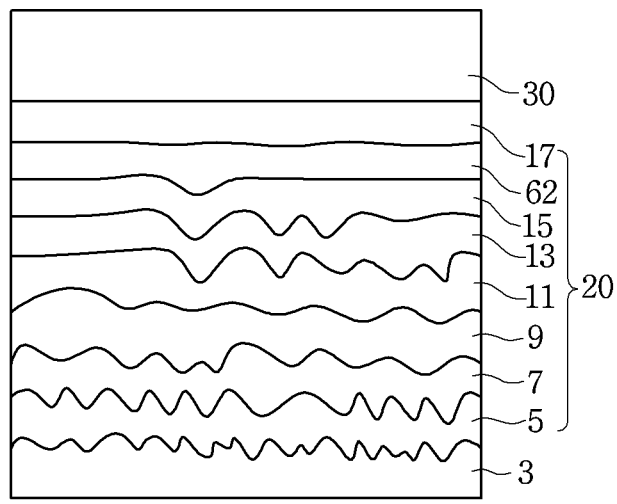
FIGS. 11A and 11B illustrate transmission electron microscope (TEM) images of the semiconductor substrate of FIG. 9.
Figure 11B:
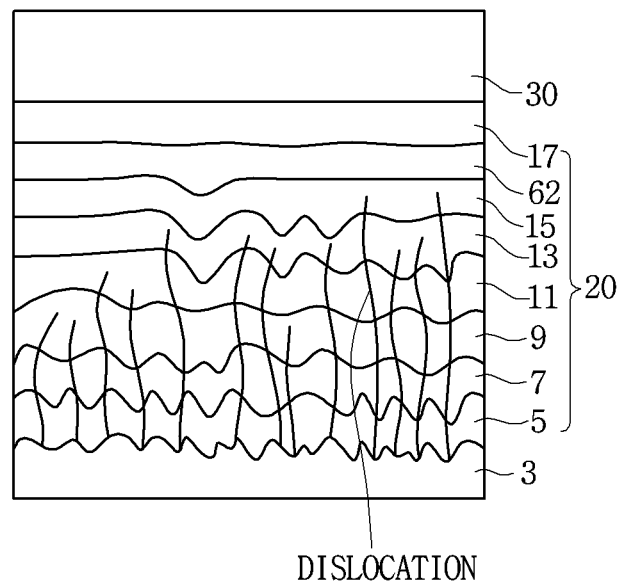

FIG. 11A and FIG. 11B are transmission electron microscope (TEM) images taken from different instruments. FIG. 11A illustrates surface roughness and FIG. 11B illustrates the presence of dislocations.

As illustrated in FIG. 11B, it may be understood that so many dislocations were generated under the heterogeneous region 62, but dislocations were almost not generated above the heterogeneous region 62.

As illustrated in FIG. 11A, surface roughness was high under the heterogeneous region 62, but the surface roughness became very low above the heterogeneous region 62, and thus, this makes a surface of the seventh step region 17 to a flat surface. Therefore, a top surface of each of the first and second nitride semiconductor layers 30 and 50 above the seventh step region 17 may be a flat surface. Accordingly, crystallinities of the first and second nitride semiconductor layers 30 and 50 may be improved.

The surface of the seventh step region 17 formed on the heterogeneous region 62 may have a nearly flat surface shape by forming the heterogeneous region 62 between the plurality of step regions 5, 7, 9, 11, 13, 15, and 17 of the buffer layer 20. That is, since the heterogeneous region 62 may reduce the surface roughness occurred due to the first to sixth step regions 5, 7, 9, 11, 13, and 15 that are formed under the heterogeneous region 62, the surface of the seventh step region 17 formed on the heterogeneous region 62 may be a substantially flat surface.

Typically, when surface roughness of a certain layer is high, defects, such as pits, may occur due to the surface roughness, and such defects become a factor of deteriorating electrical and optical properties of an electronic device.

The second embodiment makes the top surface of the semiconductor layer on the heterogeneous region 62 to a flat surface by forming the heterogeneous region 62 between the step regions of the plurality of step regions 5, 7, 9, 11, 13, 15, and 17 of the buffer layer 20, thereby enabling to improve the crystallinity.

Also, since the heterogeneous region 62 blocks dislocations moving from the seed layer 3 through the first to sixth step regions 5, 7, 9, 11, 13, and 15 and thus minimize the generation of dislocations in the nitride semiconductor layers 30 and 50 formed on the heterogeneous region 62, the crystallinity may be improved.

In addition, since the heterogeneous region 62, for example, is disposed between the six and seventh step regions 15 and 17, stress may be controlled by the heterogeneous region 62 and the step regions 5, 7, 9, 11, 13, 15, and 17. Thus, cracks may not only occur in the second nitride semiconductor layer 50, but the growth substrate 1 may also not be broken.

Figure 12:
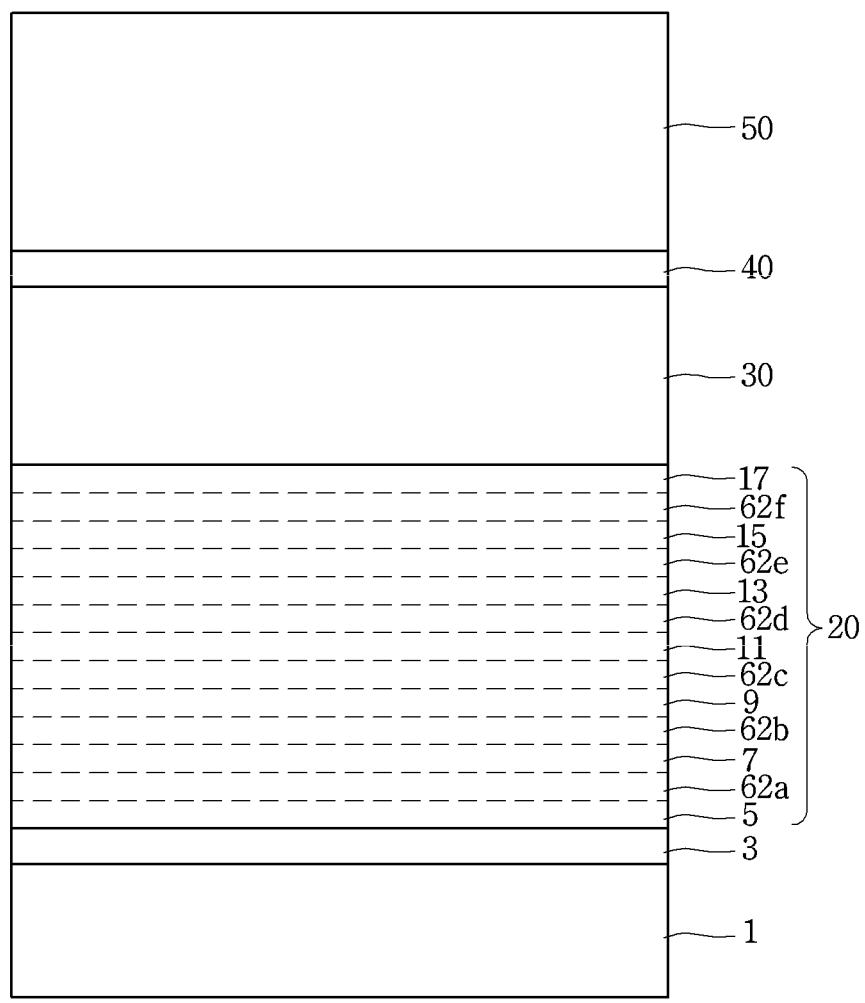
FIG. 12 is a cross-sectional view illustrating a semiconductor substrate according to a third embodiment.

FIG. 12 is a cross-sectional view illustrating a semiconductor substrate according to a third embodiment.

The third embodiment is a modification of the second embodiment in which a plurality of heterogeneous regions 62a, 62b, 62c, 62d, 62e, and 62f is disposed between first to seventh step regions 5, 7, 9, 11, 13, 15, and 17. The description below will be briefly given, and any details not described herein will be easily understood from the first and second embodiments.

Referring to FIG. 12, the semiconductor substrate according to the third embodiment may include a growth substrate 1, a seed layer 3, a buffer layer 20, a first nitride semiconductor layer 30, a stress control layer 40, and a second nitride semiconductor layer 50.

The buffer layer 20 may include the first to seventh step regions 5, 7, 9, 11, 13, 15, and 17 and the first to sixth heterogeneous regions 62a, 62b, 62c, 62d, 62e, and 62f formed between the first to seventh step regions 5, 7, 9, 11, 13, 15, and 17.

For example, the first heterogeneous region 62a may be formed between the first and second step regions 5 and 7, and the second heterogeneous region 62b may be formed between the second and third step regions 7 and 9. The third heterogeneous region 62c may be formed between the third and fourth step regions 9 and 11, and the fourth heterogeneous region 62d may be formed between the fourth and fifth step regions 11 and 13. The fifth heterogeneous region 62e may be formed between the fifth and sixth step regions 13 and 15, and the sixth heterogeneous region 62f may be formed between the sixth and seventh step regions 15 and 17.

For example, the heterogeneous regions 62a, 62b, 62c, 62d, 62e, and 62f may not be formed between all of the first to seventh step regions 5, 7, 9, 11, 13, 15, and 17. For example, the heterogeneous region 62a may not be formed between the first and second step regions 5 and 7 and the heterogeneous regions 62b, 62c, 62d, 62e, and 62f may be formed between all of the second to seventh step regions 7, 9, 11, 13, 15, and 17, but the present disclosure is not limited thereto.

For example, the first to seventh step regions 5, 7, 9, 11, 13, 15, and 17 may include AlxGa(1-x)N. In this case, x may be different in the first to seventh step regions 5, 7, 9, 11, 13, 15, and 17.

For example, the first to sixth heterogeneous regions 62a, 62b, 62c, 62d, 62e, and 62f may include AlxInyGa(1-x-y)N. Herein, x may be 0 (x=0), and y may be equal to or greater than 0 and may be equal to or less than 1 ($0 \leq y \leq 1$), but the present disclosure is not limited thereto. An amount (y) of indium (In) in each of the first to sixth heterogeneous regions 62a, 62b, 62c, 62d, 62e, and 62f may be the same or different from one another, but the present disclosure is not limited thereto.

Figure 13:
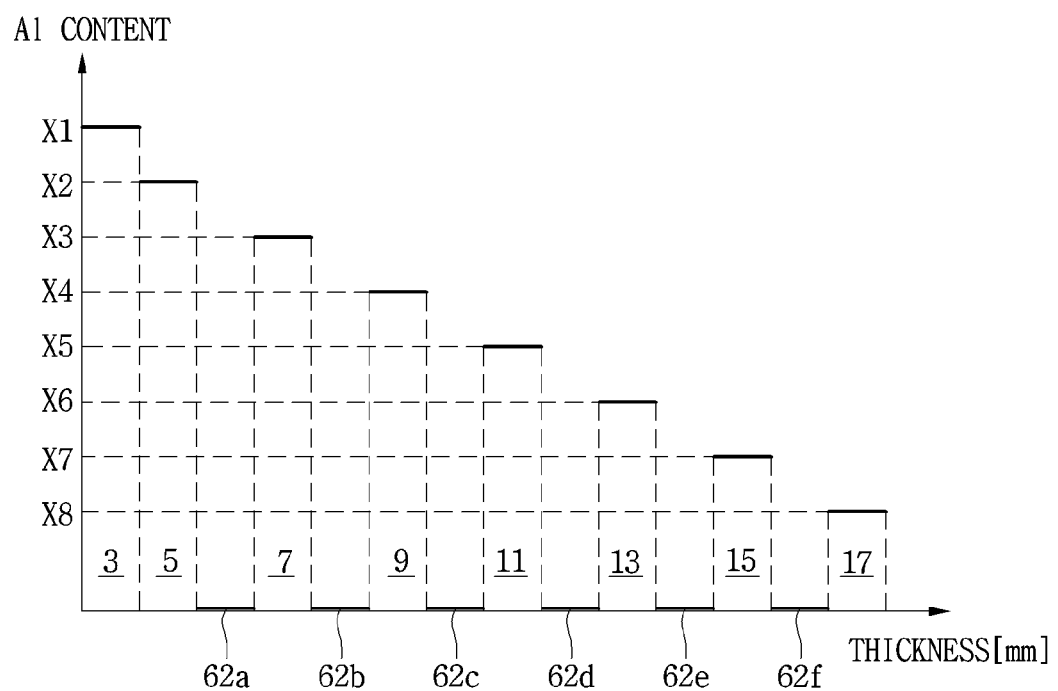
FIG. 13 illustrates an amount of Al in a buffer layer of FIG. 12.

As illustrated in FIG. 13, amounts (x2 to x8) of Al in the first to seventh step regions 5, 7, 9, 11, 13, 15, and 17 may be decreased, and an amount (x) of Al in the first to sixth heterogeneous regions 62a, 62b, 62c, 62d, 62e, and 62f may be 0.

As in the third embodiment, crystallinity may be improved and defects, such as cracks, may not occur by forming the first to sixth heterogeneous regions 62a, 62b, 62c, 62d, 62e, and 62f, which include a different nitride semiconductor material from the first to seventh step regions 5, 7, 9, 11, 13, 15, and 17, between the first to seventh step regions 5, 7, 9, 11, 13, 15, and 17.

Figure 14:
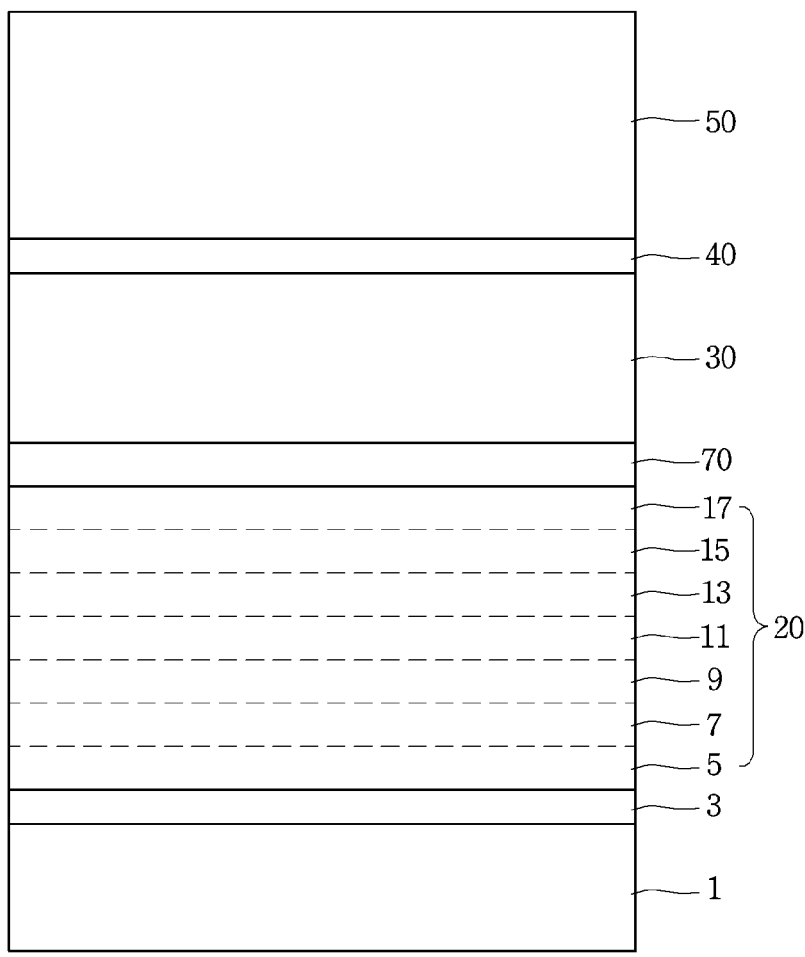
FIG. 14 is a cross-sectional view illustrating a semiconductor substrate according to a fourth embodiment.

FIG. 14 is a cross-sectional view illustrating a semiconductor substrate according to a fourth embodiment.

The fourth embodiment is substantially similar to the first embodiment except a mask layer 70 formed between a buffer layer 20 and a first nitride semiconductor layer 30. Thus, in the following description of the fourth embodiment, the same reference numerals will be assigned to the same elements having the same shape or function as those of the first embodiment and the details thereof will be omitted.

Although not described below, the mask layer 70 is equally applicable to the second and third embodiments.

Referring to FIG. 14, the semiconductor substrate according to the fourth embodiment may include a growth substrate 1, a seed layer 3, the buffer layer 20, the mask layer 70, the first nitride semiconductor layer 30, a stress control layer 40, and a second nitride semiconductor layer 50.

The mask layer 70 may be formed on the buffer layer 20, specifically, the seventh step region 17. For example, the mask layer 70 may be in contact with a top surface of the seventh step region 17. The mask layer 70 may be formed by being inserted into the first nitride semiconductor layer 30.

The mask layer 70 may be silicon nitride (SiNx) or boron nitride (BN), but the present disclosure is not limited thereto.

For example, Si2H6 gas and NH3 gas may be mixed and sprayed onto the buffer layer 20 to form the mask layer 70 including silicon nitride (SiNx) on the buffer layer 20, but the present disclosure is not limited thereto.

Figure 15:
FIG. 15 is an enlarged cross-sectional view of a mask layer of FIG. 14.

As illustrated in FIG. 15, the mask layer 70 may include a plurality of mask patterns 71. The mask patterns 71 may have various shapes, such as a triangle, a rectangle, and a polygon, when viewed from a side direction, but the present disclosure is not limited thereto. In addition, the mask patterns 71 may have various shapes, such as a triangle, a square, a hexagon, a circle, and an ellipse, when viewed from an upper direction, but the present disclosure is not limited thereto.

The mask patterns 71 may be randomly formed, but the present disclosure is not limited thereto.

The mask patterns 71 may have a protrusion protruding from a top surface of the buffer layer 20, specifically, the seventh step region 17, in the upper direction.

Since dislocations generated in the buffer layer 20 are blocked by the plurality of mask patterns 71 thus formed, the dislocations blocked by the mask patterns 71 may not further move to the first nitride semiconductor layer 30. Thus, the mask patterns 71 may reduce defect density by significantly reducing the number of dislocations in the first nitride semiconductor layer 30.

The seventh step region 17 of the buffer layer 20 may be exposed between the mask patterns 71.

The first nitride semiconductor layer 30 may be formed on the mask layer 70.

Specifically, the first nitride semiconductor layer 30 may be formed on the seventh step region 17 of the buffer layer 20 and the mask patterns 71 of the mask layer 70.

For example, the first nitride semiconductor layer 30 may be partially in contact with the top surface of the seventh step region 17 of the buffer layer 20 and may be in contact with a top surface or an inclined surface of the mask patterns 71 of the mask layer 70, but the present disclosure is not limited thereto.

The first nitride semiconductor layer 30 may be three-dimensionally grown from the inclined surface or a side of the mask patterns 71 in a horizontal direction and a vertical direction. The first nitride semiconductor layer 30 grown from the adjacent mask patterns 71 in the vertical direction and the horizontal direction is merged and may then be two-dimensionally grown in the horizontal direction. In addition, the first nitride semiconductor layer 30 on the mask patterns 71 may be grown in the horizontal direction.

Since the first nitride semiconductor layer 30 is three-dimensionally grown and is subsequently two-dimensionally grown, dislocations, which are not blocked by the mask patterns 71 and thus move between the mask patterns 71, may move in the horizontal direction rather than the vertical direction perpendicular to the top surface of the seventh step region 17 of the buffer layer 20.

In other words, the dislocations moving between the mask patterns 71 may move in the vertical direction, when the first nitride semiconductor layer 30 is three-dimensionally grown, and may move in the horizontal direction when the first nitride semiconductor layer 30 is two-dimensionally grown.

Figure 16:
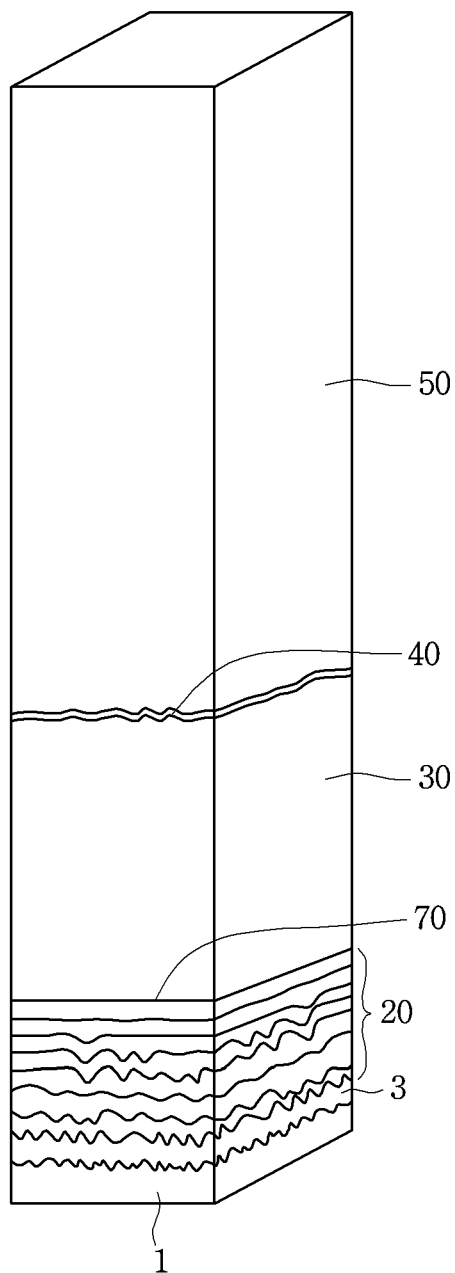
FIG. 16 is an image of the semiconductor substrate of FIG. 14.

As illustrated in FIG. 16, it may be understood that dislocations were almost not observed in the first and second nitride semiconductor layers 30 and 50 formed on the mask layer 70. Thus, crystallinity of the second nitride semiconductor layer 50 may be improved to improve the optical and electrical properties of the electronic device.

The second nitride semiconductor layer 50 may be grown to a thickness of at least 3.2 μm or more in a state in which it has excellent quality and almost no defects.

FIGS. 17A and 17B illustrate crystallinity of the semiconductor substrate of FIG. 14. FIG. 17A illustrates crystallinity of an entire area of the semiconductor substrate, and FIG. 17B illustrates a histogram of the crystallinity of the entire area of the semiconductor substrate.

As illustrated in FIGS. 17A and 17B, it may be understood that the entire area of the semiconductor substrate has a crystallinity of 305 arcsec to 330 arcsec.

Figure 18:
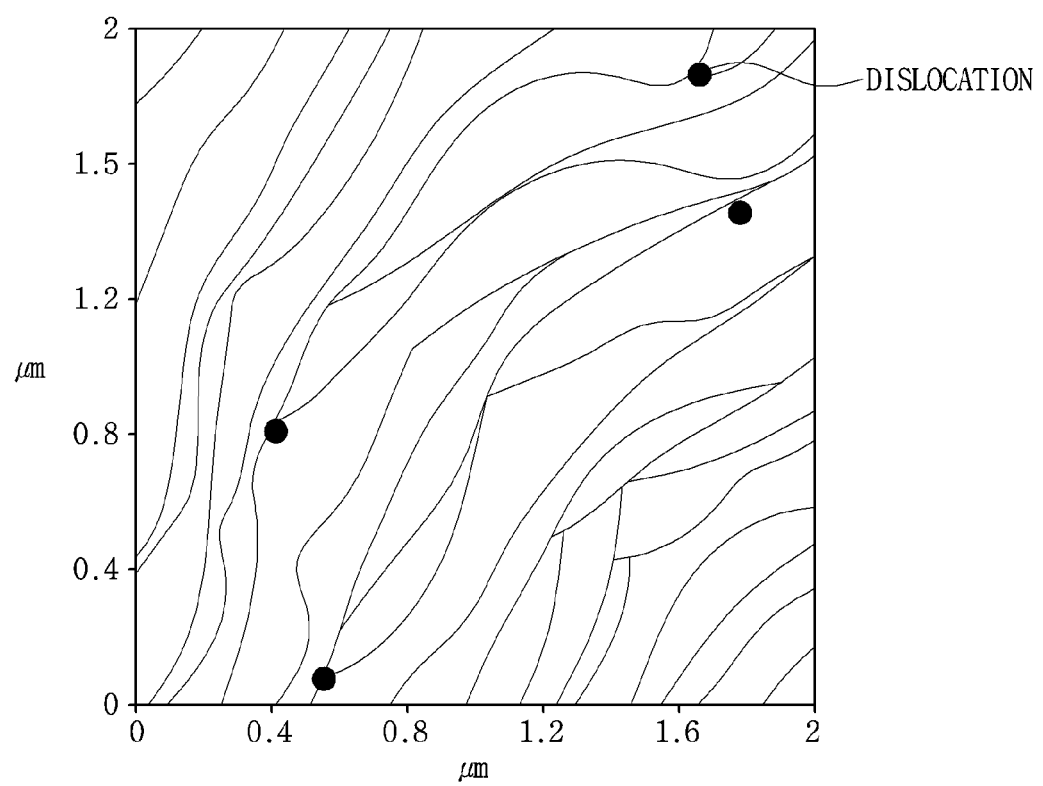
FIG. 18 illustrates defect density of the semiconductor substrate of FIG. 14.

As illustrated in FIG. 18, it may be understood that only four dislocations were generated in an area of 2 μm×2 μm. When converting into a unit, defect density was about 1E8/cm2, wherein very good crystallinity may be obtained.

Thus, the fourth embodiment may make dislocations not to move further in the vertical direction by primarily blocking dislocations of the buffer layer 20 with the mask patterns 71 of the mask layer 70 and guiding the dislocations moving between the mask patterns 71 in the vertical direction into the horizontal direction. Accordingly, since dislocations are almost not generated in an upper region of the first nitride semiconductor layer 30 or the second nitride semiconductor layer 50 formed on the first nitride semiconductor layer 30, the decrease in the crystallinity due to the dislocations may be prevented.

Figure 19:
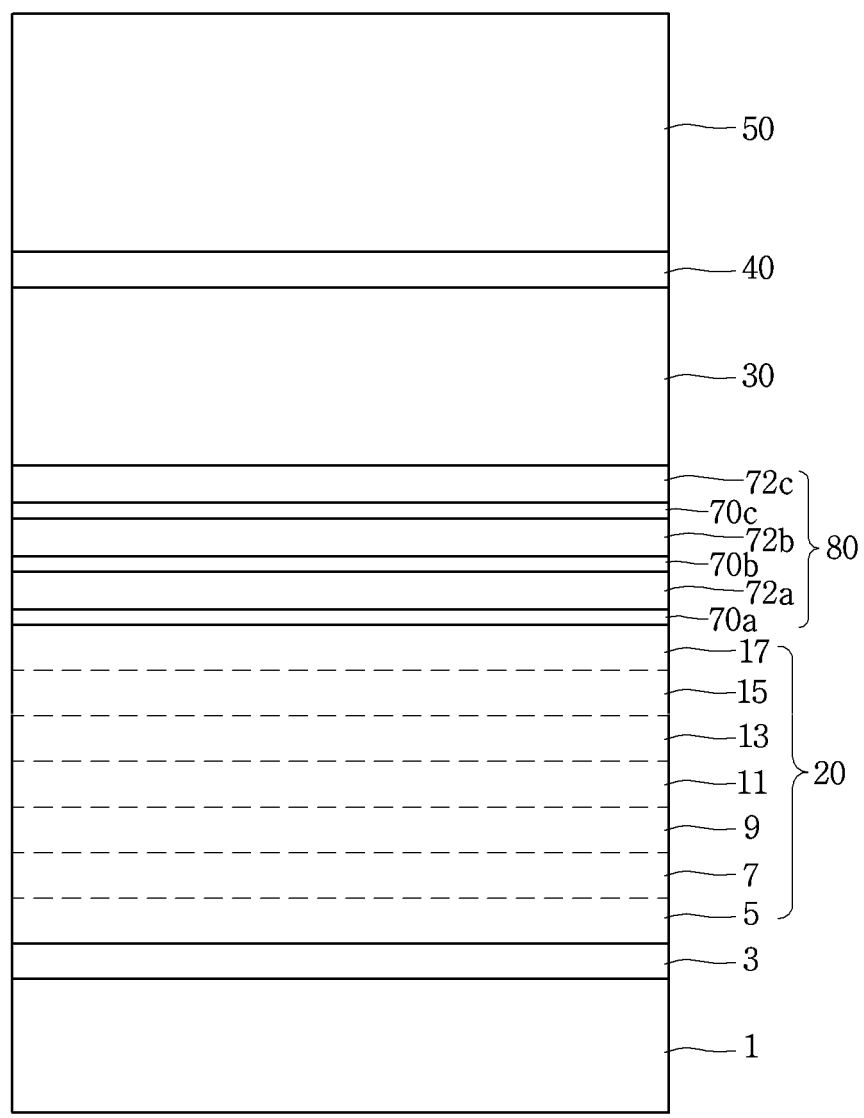
FIG. 19 is a cross-sectional view illustrating a semiconductor substrate according to a fifth embodiment.

FIG. 19 is a cross-sectional view illustrating a semiconductor substrate according to a fifth embodiment.

The fifth embodiment is substantially similar to the first embodiment except a crystallinity control layer 80 including a plurality of mask layers 70a, 70b, and 70c and a plurality of nitride semiconductor layers 72a, 72b, and 72c. Thus, in the following description of the fifth embodiment, the same reference numerals will be assigned to the same elements having the same shape or function as those of the first embodiment and the details thereof will be omitted. Details omitted in the following description will be easily understood from the first embodiment or the fourth embodiment.

Although not described below, the mask layers 70a, 70b, and 70c are equally applicable to the second and third embodiments.

Referring to FIG. 19, the semiconductor substrate according to the fifth embodiment may include a growth substrate 1, a seed layer 3, a buffer layer 20, the crystallinity control layer 80, a first nitride semiconductor layer 30, a stress control layer 40, and a second nitride semiconductor layer 50.

The crystallinity control layer 80 may include the plurality of mask layers 70a, 70b, and 70c and the plurality of nitride semiconductor layers 72a, 72b, and 72c. In other words, the mask layers 70a, 70b, and 70c and the nitride semiconductor layers 72a, 72b, and 72c may be alternatingly stacked.

For example, the first mask layer 70a may be formed on the buffer layer 20, specifically, the seventh step region 17, the first nitride semiconductor layers 72a may be formed on the first mask layer 70a, the second mask layer 70b may be formed on the first nitride semiconductor layer 72a, the second nitride semiconductor layer 72b may be formed on the second mask layer 70b, the third mask layer 70c may be formed on the second nitride semiconductor layer 72b, and the third nitride semiconductor layer 72c may be formed on the third mask layer 70c.

The first to third nitride semiconductor layers 72a, 72b, and 72c may be AlxGa(1−x)N(0<x<1), but the present disclosure is not limited thereto.

Figure 20:
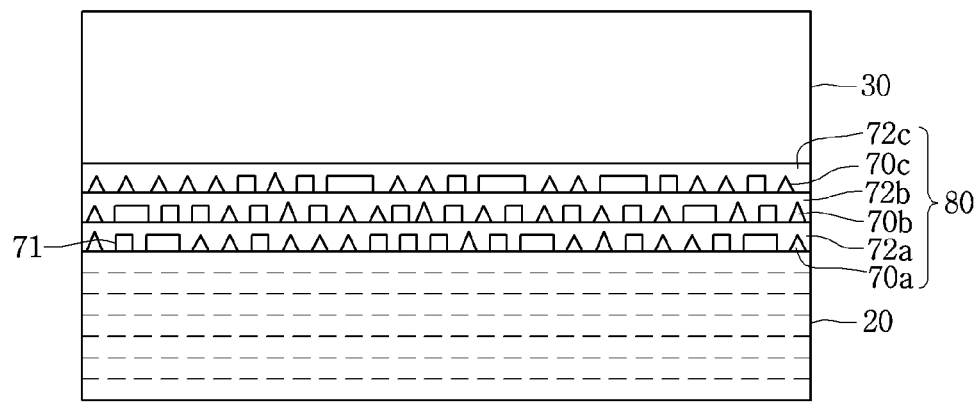
FIG. 20 is an enlarged view of a crystallinity control layer of FIG. 19.

As illustrated in FIG. 20, each of the first to third mask layers 70a, 70b, and 70c may include a plurality of mask patterns 71.

The first nitride semiconductor layer 72a may be in contact with a top surface or an inclined surface of the mask patterns 71 of the first mask layer 70a and may be in contact with a top surface of the seventh step region 17 of the buffer layer 20, but the present disclosure is not limited thereto.

The second nitride semiconductor layer 72b may be in contact with a top surface or an inclined surface of the mask patterns 71 of the second mask layer 70b and may be in contact with a top surface of the first nitride semiconductor layer 72a, but the present disclosure is not limited thereto.

The third nitride semiconductor layer 72c may be in contact with a top surface or an inclined surface of the mask patterns 71 of the third mask layer 70c and may be in contact with a top surface of the second nitride semiconductor layer 72b, but the present disclosure is not limited thereto.

The first to third nitride semiconductor layers 72a, 72b, and 72c may be grown to have a thickness of about 30 nm, but the present disclosure is not limited thereto.

When the mask layer 70a and the nitride semiconductor layer 72a are set as a pair, the fifth embodiment may be composed of about maximum 10 pairs and the maximum thickness of the 10 pairs may be about 300 nm, but the present disclosure is not limited thereto. In addition, the crystallinity control layer 80 of the fifth embodiment may be formed of at least two pairs. Thus, when the mask layer 70a and the nitride semiconductor layer 72a are set as a pair, the crystallinity control layer 80 may be composed of 2 pairs to 10 pairs.

A thickness of each of the first to third nitride semiconductor layers 72a, 72b, and 72c may be greater than a thickness of the each of the first to third mask layers 70a, 70b, and 70c. Thus, the each of the first to third nitride semiconductor layers 72a, 72b, and 72c may be formed to cover the mask patterns 71 of the first to third mask layers 70a, 70b, and 70c, but the present disclosure is not limited thereto.

As another embodiment, the thickness of the each of the first and second nitride semiconductor layers 72a and 72b may be set to be smaller than the thickness of the first and second mask layers 70a and 70b. In this case, the mask patterns 71 of the each of the first and second mask layers 70a and 70b may protrude from a top surface of the each of the first and second nitride semiconductor layers 72a and 72b in an upper direction. Thus, the mask patterns 71 of the third mask layer 70c as well as the protruded mask patterns 71 of the second mask layer 70b on the second nitride semiconductor layer 72b may be formed. The thickness of the third nitride semiconductor layer 72c may be set to be greater than the thickness of the third mask layer 70c, and thus, the third nitride semiconductor layer 72c may be formed to cover the top of the protruded mask patterns 71 of the second mask layer 70b and the top of the mask patterns 71 of the third mask layer 70c.

As another embodiment, the thickness of the each of the first to third nitride semiconductor layers 72a, 72b, and 72c may be smaller than the thickness of the first to third mask layers 70a, 70b, and 70c.

The first to third nitride semiconductor layers 72a, 72b, and 72c may be grown by using the mask patterns 71 of the first to third mask layers 70a, 70b, and 70c as seeds.

The first to third nitride semiconductor layers 72a, 72b, and 72c may be three-dimensionally grown and may be subsequently two-dimensionally grown.

Figure 21:
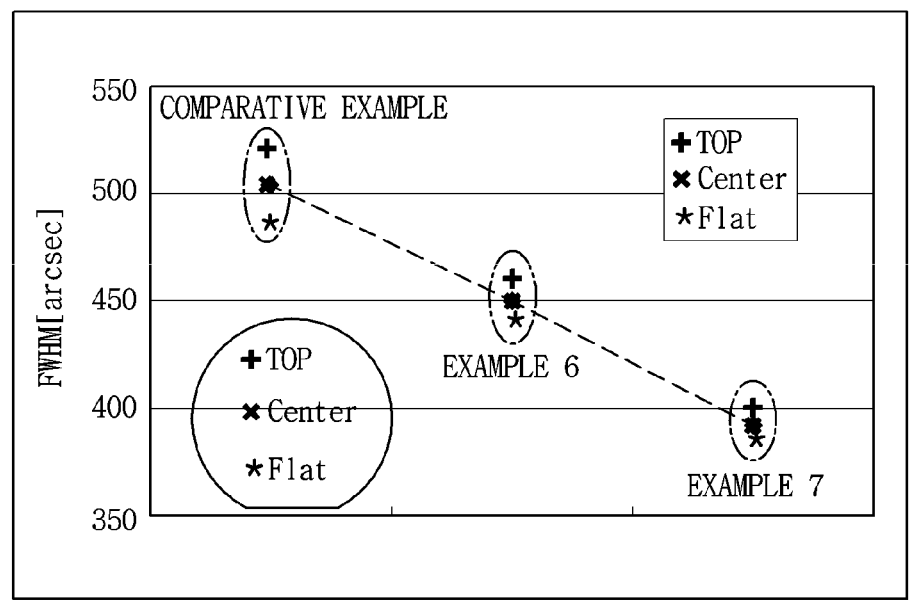
FIG. 21 is a graph illustrating crystallinities of Comparative Example, Example 6, and Example 7.

As illustrated in FIG. 21, it may be understood that Comparative Example had a crystallinity of about 500 arcsec, Example 6 had a crystallinity of about 450 arcsec, and Example 7 had a crystallinity of about 380 arcsec.

Comparative Example was a case in which the mask layer was not formed, Example 6 was a case in which the single mask layer 70 was formed, and Example 7 was a case in which the plurality of mask layers 70a, 70b, and 70c was formed.

It may be understood that Example 6 had better crystallinity than Comparative Example, and Example 7 had better crystallinity than Example 6.

The fifth embodiment may increase the probability of blocking dislocations generated in the buffer layer 20 from moving into the first and second nitride semiconductor layers 30 and 50 above the buffer layer 20 by forming the plurality of mask layers 70*a*, 70*b*, and 70*c*. In addition, the fifth embodiment may maximize the probability of blocking dislocations from moving into the first and second nitride semiconductor layers 30 and 50 in a vertical direction by guiding dislocations moving in the vertical direction into a horizontal direction by the first to third nitride semiconductor layers 72*a*, 72*b*, and 72*c* three-dimensionally and subsequently two-dimensionally formed on the first to third mask layers 70*a*, 70*b*, and 70*c*. Accordingly, since the crystallinities of the first and second nitride semiconductor layers 30 and 50 are excellent, electrical and optical properties of an electronic device fabricated on the basis of the first and second nitride semiconductor layers 30 and 50 may be improved.

Furthermore, in the fifth embodiment, since the plurality of mask layers 70*a*, 70*b*, and 70*c* and the plurality of nitride semiconductor layers 72*a*, 72*b*, and 72*c* are formed to increase compressive strain, tensile strain generated during cooling in post processing is compensated. Thus, cracks may not only occur in the first and second nitride semiconductor layers 30 and 50, but the growth substrate may also not be broken.

In the first to fifth embodiments, the growth substrate 1 may have a diameter of 100 mm or more and a thickness of 650 μm, the thickness of the buffer layer 20 may be about 1 μm, the thickness of the first nitride semiconductor layer 30 may be 1.0 μm or more, and the second nitride semiconductor layer 50 may have a thickness of 2.0 μm or more, but the present disclosure is not limited thereto.

Although not described herein, the first to fifth embodiments may be combined to achieve other embodiments, and the other embodiments thus achieved are also included within the scope of the present disclosure.

INDUSTRIAL APPLICABILITY

According to an embodiment, since a semiconductor substrate may be provided in which a thick nitride semiconductor layer having excellent crystallinity is formed, electronic devices, such as solar cells, photodetectors, or light-emitting devices, may be fabricated by using the semiconductor substrate. Thus, the semiconductor substrate may be widely used in the electronic devices or electronic devices in other areas.

What is claimed is:

1. A semiconductor substrate comprising:
a substrate;
a seed layer on the substrate;
a buffer layer on the seed layer;
a crystallinity control layer on the buffer layer;
a plurality of first nitride semiconductor layers on the crystallinity control layer; and
at least one stress control layer between the plurality of first nitride semiconductor layers,
wherein
the crystallinity control layer comprises a plurality of second nitride semiconductor layers and a plurality of mask layers alternately stacked, the second nitride semiconductor layer including $Al_xGa_{(1-x)}N$ ($0<x<1$),
each of the plurality of second nitride semiconductor layers has a thickness smaller than a thickness of each of the plurality of mask layers and each of the plurality of mask layers protrudes from a top surface of each of the plurality of second nitride semiconductor layers in an upper direction,
the buffer layer comprises a plurality of step regions and at least one heterogeneous region,
the plurality of step regions comprises a first step region and a second step region that are adjacent to the seed layer,
the seed layer and the plurality of step regions comprise aluminum (Al), and
a difference in amounts of Al between the seed layer and the first step region is in a range of 30% to 60%.

2. The semiconductor substrate of claim 1, wherein, when the mask layer and the second nitride semiconductor layer are set as a pair, the crystallinity control layer is composed of 2 pairs to 10 pairs, and a thickness of the crystallinity control layer is 300 nm.

3. The semiconductor substrate of claim 1, wherein the amount of Al in the first step region is smaller than the amount of Al in the seed layer.

4. The semiconductor substrate of claim 1, wherein an amount of Al in the second step region is smaller than the amount of Al in the first step region by 20% to 40%.

5. The semiconductor substrate of claim 1, wherein an amount of Al in each of the step regions is different, and an amount of Al in the heterogeneous region is 0.

6. The semiconductor substrate of claim 1, wherein an uppermost layer of the plurality of first nitride semiconductor layers is a conductive type semiconductor layer, and a thickness of the conductive type semiconductor layer is 2.0 .mu.m or more.

7. The semiconductor substrate of claim 1, wherein the mask layer includes $SiN_x$.

8. The semiconductor substrate of claim 1, wherein the mask layer includes a plurality of patterns.

9. The semiconductor substrate of claim 8, wherein the plurality of patterns have an irregular structure.

10. The semiconductor substrate of claim 1, wherein the mask layer has a top surface including a protrusion.

* * * * *